United States Patent [19]
DeLong et al.

[11] Patent Number: 5,892,947
[45] Date of Patent: Apr. 6, 1999

[54] TEST SUPPORT TOOL SYSTEM AND METHOD

[75] Inventors: Rance J. DeLong, Los Gatos; Jaya R. Carl, San Jose, both of Calif.

[73] Assignee: Sun Microsystems, Inc., MS Palol

[21] Appl. No.: 673,522

[22] Filed: Jul. 1, 1996

[51] Int. Cl.$^6$ .................................................. G01R 31/00
[52] U.S. Cl. ........................................ 395/701; 364/578
[58] Field of Search .................................. 395/701, 704, 395/707, 182.19, 183.09, 183.14; 364/578

[56] References Cited

U.S. PATENT DOCUMENTS

| | | | |
|---|---|---|---|
| 4,595,981 | 6/1986 | Leung | 395/183.14 |
| 4,866,611 | 9/1989 | Cree et al. | 364/705.08 |
| 4,977,520 | 12/1990 | McGaughey, III et al. | 345/330 |
| 5,093,901 | 3/1992 | Cree et al. | 345/330 |

*Primary Examiner*—Thomas Peeso
*Attorney, Agent, or Firm*—Robert P. Sabath

[57] ABSTRACT

A test support tool system and method produce software test programs from a logical description of selected software. Test programs are created by producing a cause-effect graph from the logical description, creating a decision table, producing test cases, and synthesizing test cases into a test program. The test support tool system includes an interface for receiving a logical description of software, a logical database, an analysis and test case generation module, a control module, and a test program synthesis module.

12 Claims, 11 Drawing Sheets

|  | CASE 1 | CASE 2 | CASE 3 | CASE 4 | CONDITION ENTRIES |
|---|---|---|---|---|---|
| CONDITION 1 | T | T | F | F | |
| CONDITION 1 | T | - | F | - | |
| CONDITION 1 | T | T | F | - | |
| CONDITION 1 | F | T | F | T | |
| EFFECT 1 | T | T | F | F | |
| EFFECT 2 | F | F | T | F | |
| EFFECT 3 | F | F | F | T | EFFECTS ENTRIES |

CONDITION STUB

EFFECTS STUB

FIG. 9

TEST SUPPORT TOOL SYSTEM AND METHOD

TECHNICAL FIELD

The invention herein relates to the field of test support tool systems and methods, and more particularly to the field of automated software test generation and synthesis based upon a selected software specification.

BACKGROUND OF THE INVENTION

Current software test generation tools and methods rely in great part upon manual or partially automated approaches. Once a particular software design has been produced, considerable human intensive activities are required to establish test conditions and test programs for support of testing and evaluation of the software design and implementation. Such human and non-fully automated activities are costly and irregular in performance. It is accordingly desired to reduce or eliminate human involvement in the development of tests for software evaluation.

FIG. 1 is a flow chart of a conventional process for software test program generation. The current process includes creating a particular software design 3 which requires testing. Human intensive activities 4 are then undertaken to establish applicable test conditions 5 appropriate to evaluate desired features or functionalities of the software design. Additional human intensive activities 6, 8 are performed to produce specific test cases 7 and programs 9 which can test the implementation of software design 3 for predetermined functions and operations. According to the prior art, a system under test (SUT) is machine processed 11 with test programs 9 to produce test results 12, and then the test results are human processed 13 to produce a test report. Such human intensive activities are ineffective and inefficient and error prone.

SUMMARY OF THE INVENTION

According to the present invention, software test programs are generated according to a substantially automated process which includes the generation of a minimal necessary set of test program specifications sufficient to demonstrate a selected functionality for a particular software design. In particular, according to the present invention, a logical description of selected software is created. Next, a cause-effect graph is produced from the logical description. The cause-effect graph is then converted into a decision table. Test cases are produced from the decision table, and the test cases are synthesized into a test program or suite of test programs. Thus, according to one embodiment of the present invention, a suite of test programs is substantially automatically synthesized from a logical description of all or part of a selected software design. According to another embodiment of the present invention, a suite of security test programs are automatically developed for a selected secure operating system software design by implementing specification based testing with programmatic identification and synthesis of selected test programs.

DESCRIPTION OF THE DRAWINGS

FIG. 9 is a limited entry decision table representing a suite of tests derived from a logical description in accordance with the present invention.

DESCRIPTION OF THE PREFERRED EMBODIMENT

Figure 1:
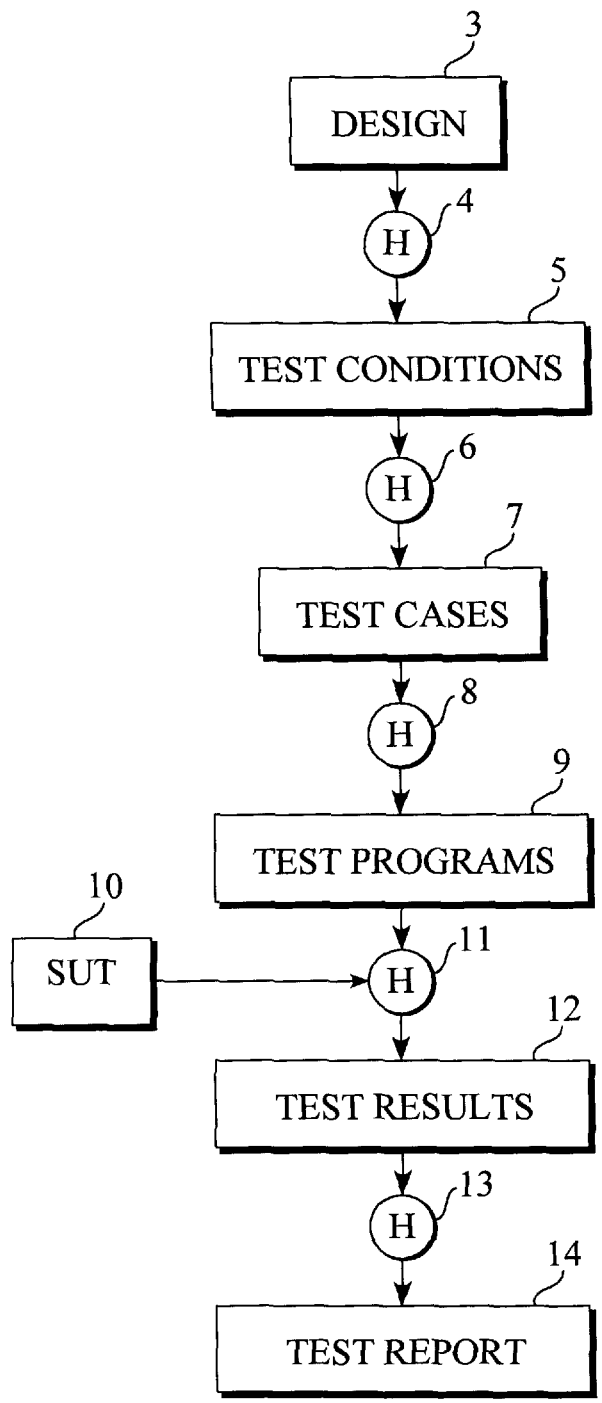
FIG. 1 is a flow chart of a conventional process for software test generation.
Figure 2:
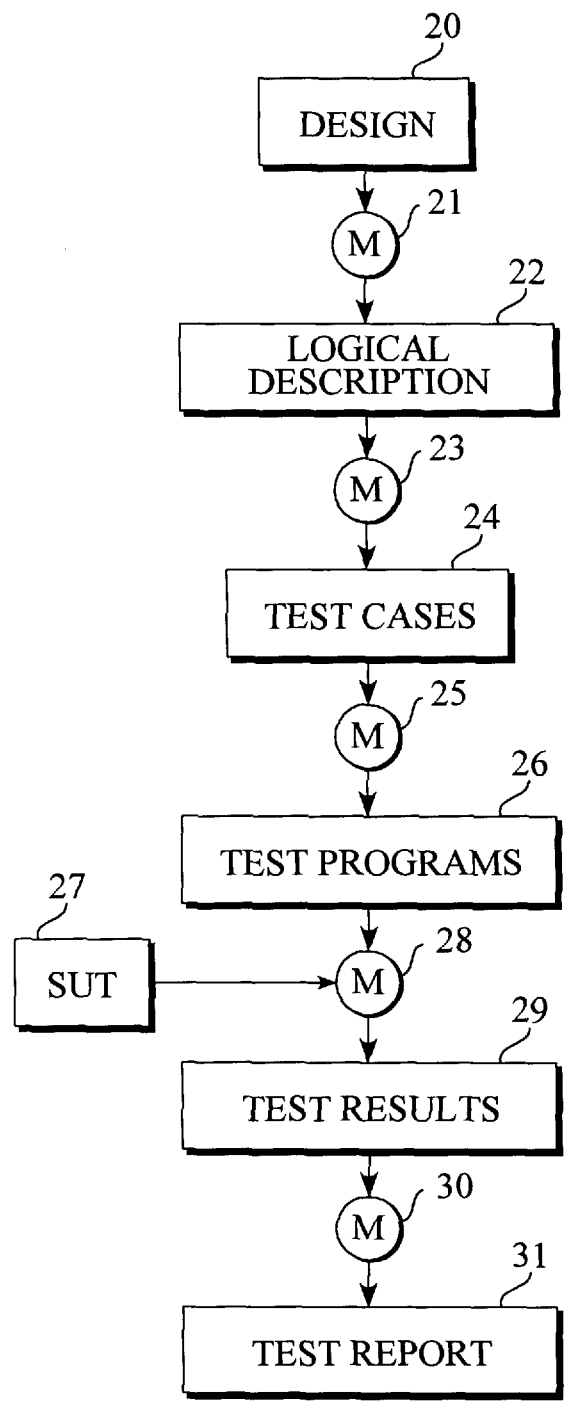
FIG. 2 is a flow chart of an automated software test generation method according to the present invention.

FIG. 2 is a flow chart of an automated software test generation method according to the present invention. In particular, a method according to the present invention includes creating a selected software design 20 which is separately reduced to software under test (SUT) 27. By performing human intensive activities 21, a logical description 22 of selected features of software design 20 is created. According to one embodiment of the present invention, the selected features include predetermined security functions.

In particular, according to one embodiment of the present invention, logical description 22 describes the behavior of the TCB interfaces based on the system design. In general, logical description 22 is expressed in a first order logic according to one embodiment and is processed in several phases. First, the logical description 22 is checked, massaged, and placed in a logical database in which other tools in the test-development environment can readily access logical description 22. A Logical Description Language processor having semantics definable by a tool engineer to support the intended interpretation of logical descriptions is employed according to the present invention. The built-in semantics include a predefined vocabulary of predicate and function symbols and a set of semantic rules including signatures of predefined n-ary function and predicate symbols; definitions of types of formal and environmental parameters; mappings to corresponding names; test environment primitives; and axioms that describe the behavior and relationships among the software tested and test environment primitives. Every primitive, predicate symbol, function symbol, and constant in a logical description is included in the predefined vocabulary and has a semantic definition in the rule base. This definition is used to check the symbol's correct use and to enable and direct the use of the corresponding system function in synthesized test programs. The Logical Description Language according to the present invention is based upon formal logic concepts including first-order theory/language; clausal form logic; interpretations and models; and axioms and inference rules. A first order theory is a tuple, T=<A, L, X, I>, where A is a finite alphabet of terminal symbols; L is the language consisting of formulae which may be constructed from A; X is a system of axioms in the language; and I is a set of inference rules for constructing new formulae in the language. An alphabet is a tuple, A=<V, C, F, P, C1, Q1, P1>, where V is a set of variables; C is a set of constants; F is a set of function symbols; P is a set of predicate symbols; C1 is the set of logical connectives, { ∧v~ -> <- ->}, which may also be represented by other equivalent symbols; Q1 are the logical quantifiers for all X and exists X; and P1 are these punctuation symbols, ( ). Variable, constant, function, and predicate names are composed of the alphanumeric characters and underscore. Variable names must start with an uppercase letter; all others must start with a lowercase letter. The language consists of expressions constructed from the alphabet according to inductive definitions of terms, atomic formulae and well formed formulae (WFF). Constants and variables are considered terms. If f is an n-ary function symbol and $t_i$ are terms, then $f(t_1, t_2, \ldots, t_n)$ is a term. The symbols true and false are atomic formulae. If p is an n-ary predicate symbol and $t_1$ are terms, then $p(t_1, t_2, \ldots, t_n)$ is an atomic formula. An atomic formula is a WFF. If $w_1$ and $w_2$ are WFF, then so are $(w_1 \wedge w_2)$; $(w_1 \vee w_2)$; $(w_1 \text{-->} w_2)$ and $(w_1 \text{<-->} w_2)$. If x is an element of V and w is a WFF, then so are (for all X)w, and (exists X)w. If w is a WFF, then so is the expression ~w. The set of logical connectives is extended to permit multiple conjunction and multiple disjunction. Thus, if $w_i$ are WFF, then so are $w_1 \wedge w_2 \wedge \ldots \wedge w_n$; and $w_1 \vee w_2 \vee \ldots \vee w_n$. If A is an atomic formula, then A is a (positive) literal, and ~A is a (negative) literal. If B is a clause consisting of literals Li, then distinguishing between positive and the negative literals results in a form for B:

$$\sim A_1 v \sim A_2 v \ldots v \sim A_m v C_1 v C_2 v \ldots v C_n$$

which may alternatively be represented as $C_1, C_2, \ldots, C_n \text{<-} -A_1, A_2, \ldots, A_m$ where the disjunction of consequents $C_1$ is referred to as the head, and the conjunction of antecedents $A_1$ is referred to as the body of the clause. Table 1 includes particular cases of interest.

TABLE 1

| | |
|---|---|
| n >= 1 and m = 0 | an *assertion* |
| n = 0 or n = 1 | a *denial* |
| n = 0 and m = 0 | a *contradiction* |
| n = 0 or n = 1 | a *Horn* clause |
| | n = 1 a *definite clause* |
| | n = 0 a *definite goal* |
| | n = 1 and m = 0 a *fact* |
| n > 1 | an *indefinite clause* |

A logic program is a set of clauses in conjunction: $C_1 \wedge C_2 \wedge \ldots \wedge C_n$ which may be written (eliminating the "∧" operator):

$C_1$
$C_2$
...
$C_n$

A set of clauses all having predicate p in the head is called a definition of p.

The Logical Description Language further permits a modified clausal form, in which the body may contain, rather than just a list of antecedents, a quantifier-free WFF[1]. Such clauses can be shown to be equivalent to a set of proper clauses but permit a more natural expressiveness.[2]

[1] All variables in clausal form are assumed to be universally quantified. The Logical Description Language also permits nonclausal WFF with quantifiers to express effects. These are automatically converted to a set of clauses.

[2] The Logical Description Language also permits nonclausal WFF with quantifiers. These are automatically converted to a set of clauses.

Further, the stored logical description 22 (in FIG. 2) is next analyzed, with selected techniques and heuristics, to identify applicable test cases and test data values. The resulting declarative test specifications are also placed in the logical database for further processing. Additionally, using stored test specifications and a built-in rule base, a final processing phase synthesizes test programs 26 in an imperative language, such as "C" programming language, Bourne shell command language, or, for example, Xrunner™ script (for graphical user interface (GUI) tests). Test programs 26 thus target and execute in a test environment providing a set of primitives that support different testing paradigms for network, kernel, X protocol, and GUI windows system testing. The test environment also supports collecting test results 29 for subsequent interpretation and reporting.

Logical description 22 according to one embodiment of the present invention, defines input/output relations for salient features of a selected function. Logical descriptions 22 according to the present invention are written in the Logical Description Language (LDL), for example, a first order logic language with a vocabulary based on the system being described. Logical description 22 is converted to Horn clauses and represented as a directed acyclic graph according to an embodiment of the present invention.

Logical description 22 according to one embodiment has elements including a modification history of the logical description; including references, documents or other sources, referred to in preparing logical description 22; including tags, i.e., specific items in the references that are addressed by this logical description; including primitive conditions, i.e., atomic formulae expressing candidate conditions on the input domain of the function being described; including constraints, i.e., additional facts that express relations on the input conditions, on the logical description, or on test cases generated from a logical description; including operation, i.e., signature (number and type of arguments and results) of the function being described and auxiliary information needed to generate concrete test cases; and including effects, i.e., clauses or well-formed formulae constituting a pure logic program for the input/output relation of the function being described. All of these elements of logical description 22 are optional except for effects which are required for test case generation. Thus, a simple logical description could consist of an effects element alone. Logical description 22 is subject to machine processing 23 (i.e., computer processing) including performing a cause-effect analysis as discussed in detail below, to produce test cases 24. Test cases 24 are then machine processed 25 to produce test programs 26, which in turn are subject to machine processing 28 with the TCB (or generally SUT, i.e., software under test) 27 to produce test results 29. Finally, test results 29 are subject to machine processing 30 to produce a test report 31.

A cause-effect analysis is performed in accordance with the present invention, by machine processing 23 to produce a set of combinations of test conditions which are used in determining whether predetermined functions are properly performed. According to one embodiment of the present invention, logical description 22 includes functional coverage traceability information. Functional coverage is measured with machine processing 28 by comparing the functional requirements established in test cases 24 to all prespecified functional requirements of software design 20. By inclusion of functional requirement tag information in logical description 22 and by tracking the derivation of test cases, the tested functional requirements may be compared against the set of all functional requirements.

Cause-effect analysis according to the present invention includes establishing a cause-effect graph by representation of logical conditions and effects of a selected function being stated in terms of the logical conditions. The method produces a high-yield set of combinations of the input conditions that effectively probe the implementation and expose ambiguities and incompleteness in the specification. Cause-effect graphing includes identifying causes (input conditions) and effects (actions) and assigning an identifier to each cause and effect.

Cause-effect analysis is particularly performed according to the present invention by identifying primitive atomic conditions on the input to the function and identifiers optionally assigned within the logical description. Constraints on these conditions are also identified. Effects are described in terms of logical expressions involving the primitive atomic conditions. An effect is selected, and input conditions are determined that will produce that effect. The result of this procedure is a set of elementary test cases. The procedure is applied to each effect in the graph. Constraints are applied throughout the process to assure that invalid or impossible test cases are rejected early. Whenever possible, elementary test cases are merged when they involve either disjoint or compatible valuations. This merge results in a compact, high-yield set of abstract test cases. The boundary-value analysis is employed according to the present invention to supplement cause-effect analysis and to probe specifically for errors at the boundaries of the domains of input and output parameters. According to an embodiment of the present invention, heuristic rules and facts serve to direct the boundary-value analysis.

Generation of test cases 24 according to the present invention includes use of analysis techniques employing logical descriptions of the software to be tested (e.g., TCB interfaces) and test-system rule bases to produce a set of declarative test cases. Because of the potential combinatorial explosion of test cases 24, the process of the present invention eliminates test redundancy without sacrificing test coverage, by selecting compatible and strategic collections of test conditions, and select test-data values simultaneously compatible with the test conditions and other applicable constraints. The process of test-case generation further employs a collection of generators and filters, intervening between logical description 22 and test cases 24, as will be described in greater detail below in connection with FIG. 6.

Each test case 24 according to the present invention specifies a set of postconditions that should hold after the activation of particular functions of software design 20, provided that a precondition specified in the test case holds before the activation. Test-case specifications are declarative (that is, nonprocedural) and do not describe how or in which order the preconditions are to be achieved or the postconditions verified. Test cases also omit representation details. Test cases are abstractions of test programs, which are imperative (that is, procedural). Test program 26 according to one embodiment of the present invention includes setup code achieving the specified test case preconditions, operation code performing selected functions under test, and verification code checking expected test case postconditions. A program-synthesis technique is employed according to one embodiment of the present invention to generate test program(s). In the case of test-program synthesis, it is not desired to synthesize a program that meets the specification represented by the logical description; this code has already been implemented as the system under test. Instead, it is attempted to synthesize a sequence of code that realizes the specification represented by the test preconditions. The preconditions of the test case are used as the postconditions of the setup code. The operation code of test program 26, according to the present invention, is the invocation of the function under test with parameters that are instantiated either as part of test-case generation or during the execution of the setup code. The verification code tests whether the postconditions hold after the operation. According to the present invention, simple atomic conditions are produced and verified. Program synthesis utilizes a specification of a program (or program segment) and a set of axioms describing the allowable primitives. According to such program synthesis, the existence of a program is sought to be proved, which, written in primitives, satisfies the specification. The method of proof must be sufficiently constructive to yield, as a by-product of the proof, an instance of the program the existence of which was just proven. The techniques forming the backbone of the synthesis subsystem is the deductive tableau[3], using polarity strategy[4] and an extension to situational logic[5] called imperative-program theory. The proof begins by formulating a (would-be) theorem that postulates the existence of such a program, and by entering it as a goal in the deductive tableau. The applicable set of axioms will have already been implicitly entered as assertions in the tableau. The proof proceeds by applying a set of inference rules, according to a polarity strategy, repeatedly until a termination condition is met or there are no applicable rules. In the first case, the proof has succeeded; in the latter, additional information is needed to derive the proof. Such a case will most likely require the introduction of additional axioms or lemmas. When a proof is complete, the output column(s) of the tableau contain expressions, extracted from the proof, that abstractly describe the computation that satisfies the original specification. This computation is that corresponding to a test program satisfying the test specification.

[3]The deductive tableau is a methodology for program synthesis developed by Manna and Wandinger.
[4]The polarity strategy is used to guide the selection and application of inference rules during a proof.
[5]Situational logic is a logical theory in which computational states are explicit objects, permitting predicate truth values to be state dependent.

Figure 3:
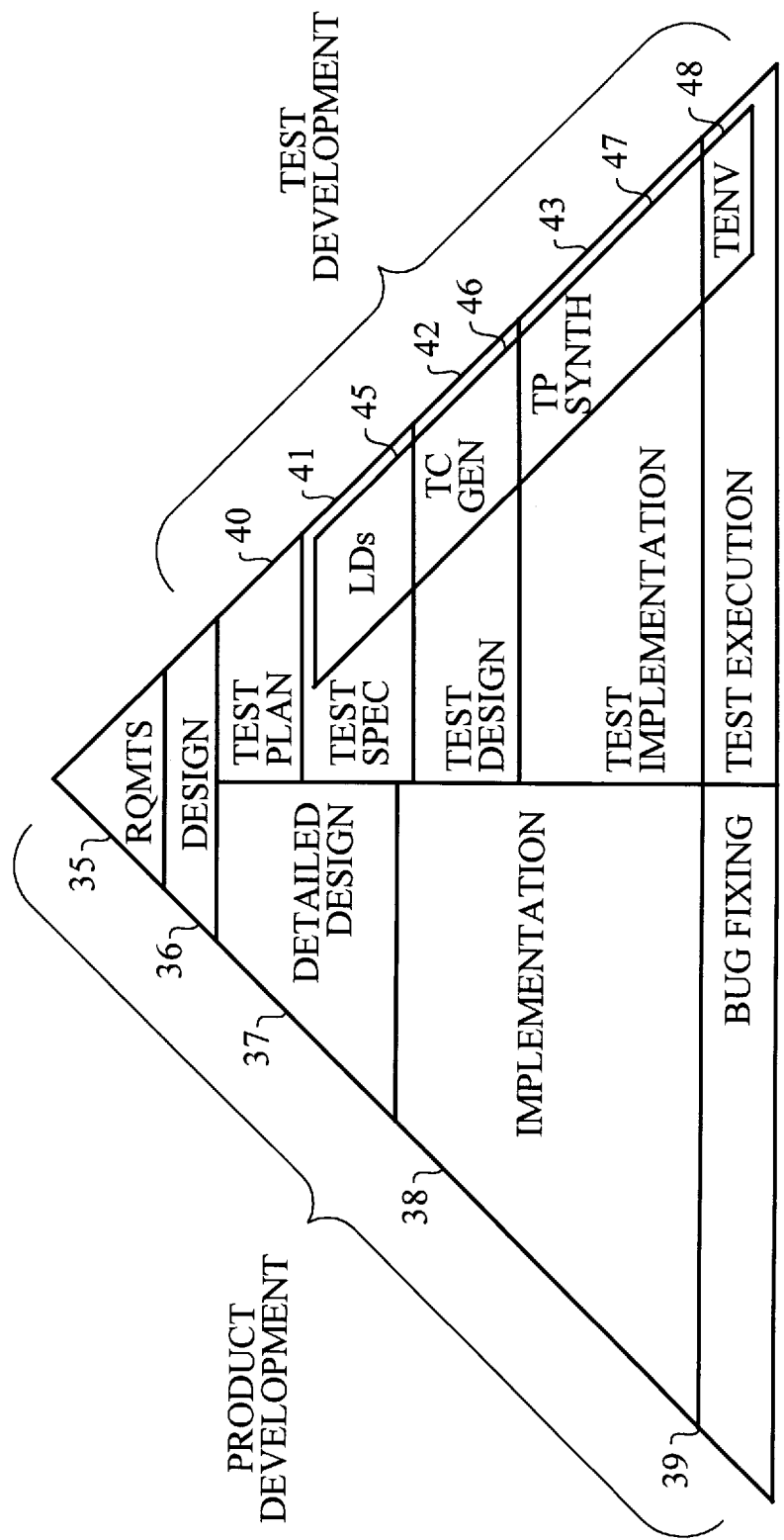
FIG. 3 is a diagram of an automated test development process according to the present invention, compared to a conventional test development approach.

FIG. 3 is a diagram of the effort required to use the automated test support tool according to the present invention, compared to that required for a conventional test development approach. In this diagram, the area of the components of the figure are indicative of the magnitude of the human effort associated with producing each component. In particular, product development of a software architecture typically includes establishing detailed software requirements 35, designing 36 the software according to these requirements 35, making a detailed design 37, implementing 38 the design, and fixing bugs 39 in the design 36 and/or implementation 38. Test development conventionally includes establishing a test plan 40, determining test specifications 41, establishing a test design 42, performing a test implementation 47, and executing 44 the test or tests developed. According to the present invention, once a test plan 40 has been established, logical descriptions (LDs) 45 are developed, test cases (TCs) 46 are generated, test programs (TPs) 47 are synthesized, and a test environment (T ENV) 48 is established.

Figure 4:
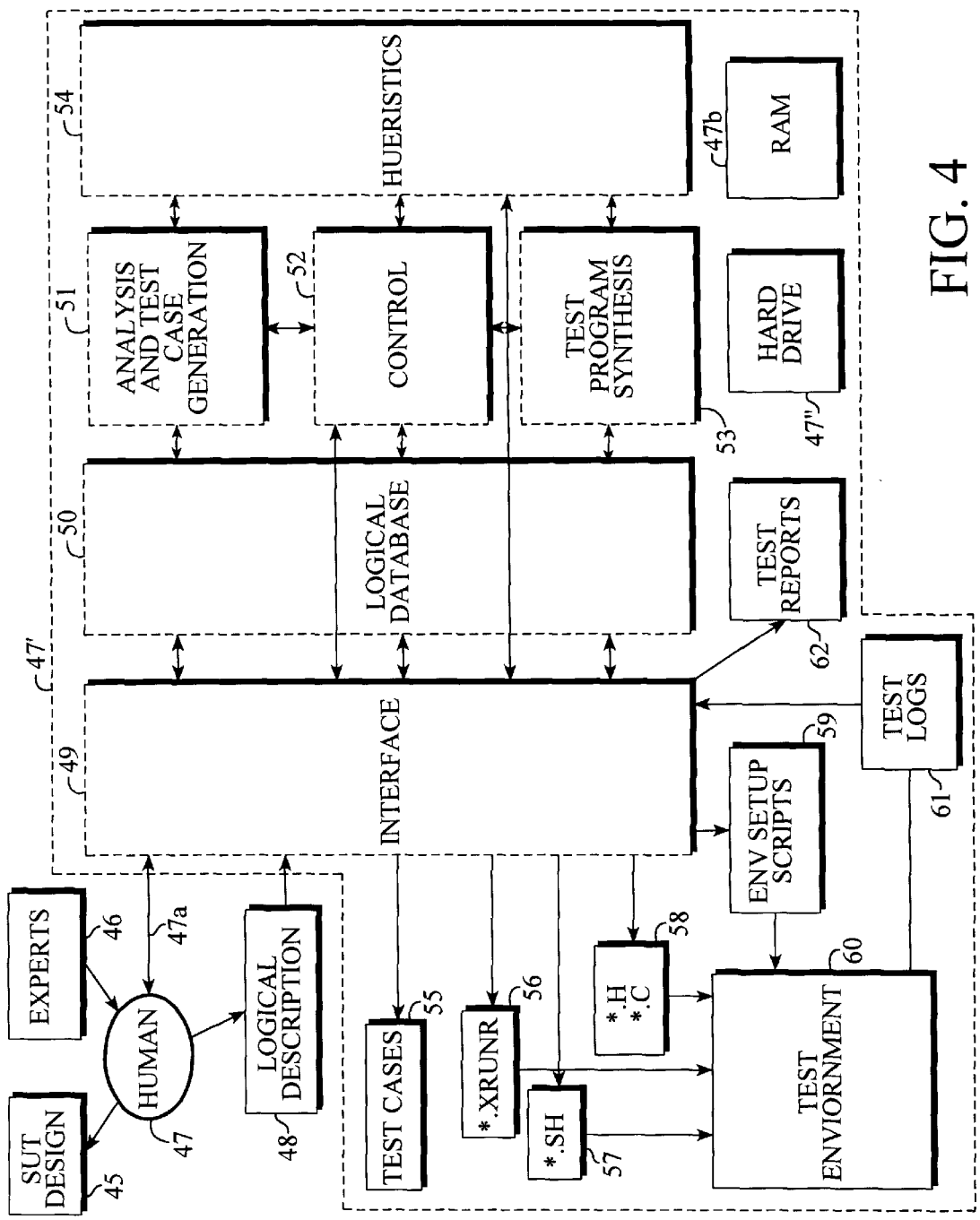
FIG. 4 is a diagram of a test support tools architecture according to the present invention.

FIG. 4 is a diagram of a test support tools architecture 47' according to the present invention. In particular, test support tools architecture 47' accepts a logical description (LD) 48" of a selected software design 45" (e.g., SUT design) created by human intervention 47" relying upon input from experts 46 (SUT is a particular embodiment of a system under test, for which this test support tool and method was originally conceived and developed). Test support tools architecture 47" further includes an interface 49, a logical database 50, an analysis and test case generation module 51, a control module 52, a test program synthesis module 53, and a heuristics module 54. Interface 49 receives logical description 48" and user interaction 47a, and communicates with logical database 50, control module 52, and heuristics module 54. According to one embodiment of the present invention, control module 52 includes a computer controller. The computer controller may be a network of microprocessors or computers. In an alternate embodiment, control module 52 contains machine readable code that sequences the activities of the other modules and regulates their interactions. The interface 49 also performs lexical and syntactic analysis of the LD 48 and other user commands 47a. Logical database 50 maintains logical description 48" as originally received, as well as its derivative forms, test cases, and intermediate forms of test programs. Input/output actions from interface 49 have the logical database 50 as the source or destination. Analysis and test case generation module 51 performs semantic checks of logical description 48" and performs test case generation procedures. Test program synthesis module 53 uses rule bases in the heuristics module 54 to convert test specifications stored in the logical database 50 into schemas of test programs which are placed back into the logical database 50. Control module 52 sequences performance of activities by interface 49, logical database 50, analysis and test case generation module 51, test program synthesis module 53, and heuristics module 54. Test support tools architecture 47' according to the present invention includes a test environment 60 including a set of testing primitives and mechanism to change the state of the environment, and mechanism to collect test logs. Logical database 50 in turn communicates with interface 49, analysis and test case generation module 51, control module 52, and test program synthesis module 53. Analysis and test case generation module 51 communicates with logical database 50, heuristics module 54, and control module 52. Control module 52 communicates with logical database 50, analysis test case generation module 51, heuristics module 54, and test program synthesis module 53. Test program synthesis module 53 communicates with logical database 50, control module 52, and heuristics module 54. The test support tools architecture further includes human readable test cases 55 produced from interface 49. The test support tools architecture additionally includes human readable and computer executable test programs 56' including *.xrunr scripts 56, *.sh scripts 57, and C language programs comprising *.c and *.h files 58, provided from interface 49. According to the present invention, test programs 56' are provided to a test environment 60. Test support tools architecture 47' further produces environment setup scripts 59 which are provided to test environment 60. Test support tools architecture 47' additionally produces test logs 61 produced from test environment 60 and provided to interface 49. Test support tools architecture 47' additionally produces a test report 62 output through interface 49.

Figure 5A:
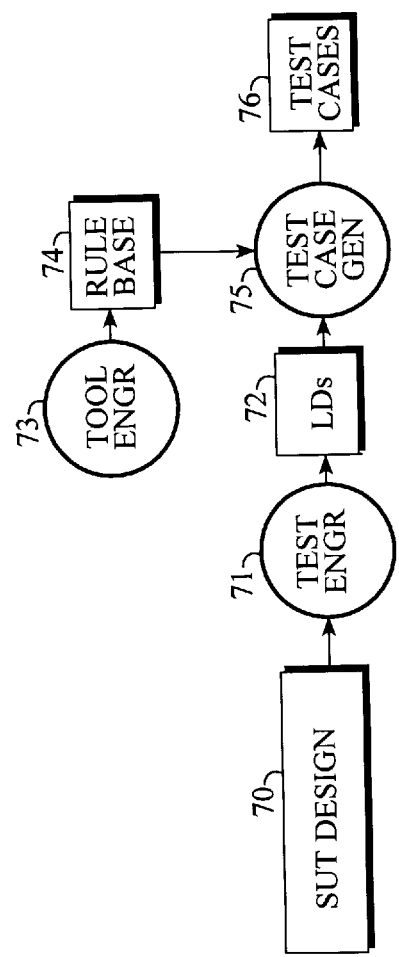
FIG. 5A is a diagram of a logical description (LD)-based test process according to one embodiment of the present invention, which does not feature feedback.

FIG. 5A is a diagram of a logical description (LD)-based test method according to one embodiment of the present invention, which does not feature feedback. In particular, the LD-based test involves having a test engineer 71 creating logical descriptions (LDs) 72 of a software design 70 (e.g., SUT design). Separately, a tool engineer 73 employs a rule-based module 74 to establish a test case generator 75 for the logical descriptions 72. Test case generator 75 then produces test cases 76.

Figure 5B:
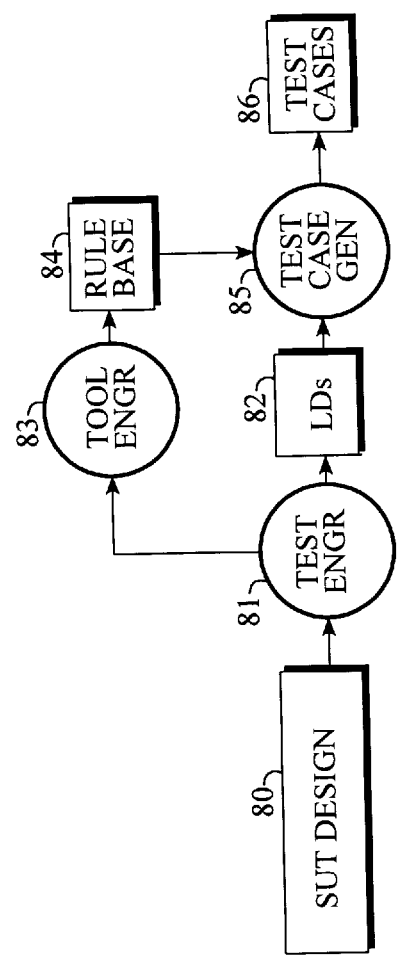
FIG. 5B is a diagram of a logical designation (LD)-based test process according to an embodiment of the present invention, in which the test development process is enhanced with feedback.

FIG. 5B is a diagram of a logical designation (LD)-based test method according to an embodiment of the present invention, in which the test development is enhanced with feedback. In particular, the LD-based test with feedback includes having a test engineer 81 creating logical descriptions (LDs) 82 of a software design 80 (e.g., SUT design). A tool engineer 83 employs a rule-based module 84 to establish a test case generator 85 for logical descriptions 82. Test case generator 85 then produces test cases 86. Additionally, feedback is provided from test cases 86 by manual inspection, for example, to cause test engineer 81 to modify logical descriptions 82 and to provide input to tool engineer 83 as to the results of test cases 86. As a result of the feedback to test engineer 81 in modifying logical descriptions 82, test cases 86 will be modified by operation of test case generator 85 upon logical descriptions 82. Further, the feedback to test engineer 81 provided to tool engineer 83 results in modification of rule-based module 84, which in turn causes adaptation in test case generator 85. As a result, an adaptation in test cases 86 is made as a result of feedback to test engineer 81.

Figure 6:
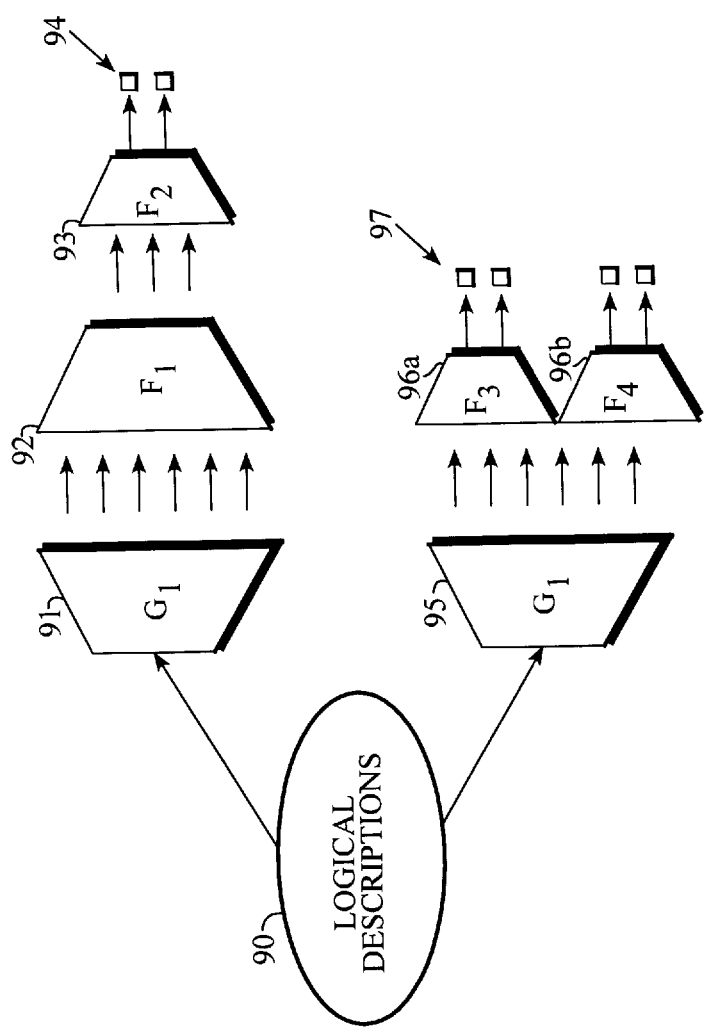
FIG. 6 is a diagram of the generator and filter paradigm defining a test space according to the present invention.

FIG. 6 is a diagram of generators and filters defining a test space according to the present invention. In particular, logical description 90 are subject to a first generator 91 which produces alternatives in turn subject to a first filter 92 which applies criteria which may reject particular ones of the alternatives as invalid or unnecessary. First filter 92 may be succeeded by second filter 93 which applies other criteria effective for rejecting particular ones of the alternatives which survived first filter 92, leaving only alternatives 94 as surviving tests. Logical description 90 may further be subject to generation of other alternatives by second generator 95 which are then evaluated in first and second groups by third and fourth filters respectively 96a and 96b, producing remaining alternative 97 as surviving tests.

Generators 91 and 95 implement aspects of the logical description and elaborate a set of alternatives that may be test cases or precursors to test cases. The generation technique produces useful and valid alternatives as well as alternatives that may be in some views redundant or invalid.[6] Filters 92, 96a and 96b take the alternatives produced by a generator and, by applying criteria specific to a particular selection strategy, reject some of the alternatives as invalid or unnecessary. Filters may be applied in series (as are 92 and 93 in FIG. 7) or in parallel (as are 96a and 96b in FIG. 6) to the results produced by generators or other filters. Generators 91 and 95 are designed to prune the space of alternatives effectively and early. It is desirable according to one embodiment to use an initial generator that eliminates in predictable ways alternatives, which can later be restored in a more controlled way by another, more specific, downstream generator. Following this paradigm, the test support tool according to the present invention considers and generates classes of input alternatives, which may be described as having a selected property, and later generates and select specific values that satisfy that property. The test support tools method according to the present invention includes combining generator and filter elements for logical description analysis, and using cause-effect analysis, constraint satisfaction, and boundary-value analysis.

[6]A trivial generator may simply elaborate all combinations of all values in the domain of each input variable. Such a generator has no practical value since the kinds of functions in the TCB interface are functions of multiple variables with large domains. The impracticality of such a generator is obvious: for a function of just a few integer variables, generating one alternative each millisecond would require thousands of years to elaborate all distinct input alternatives.

Figure 7:
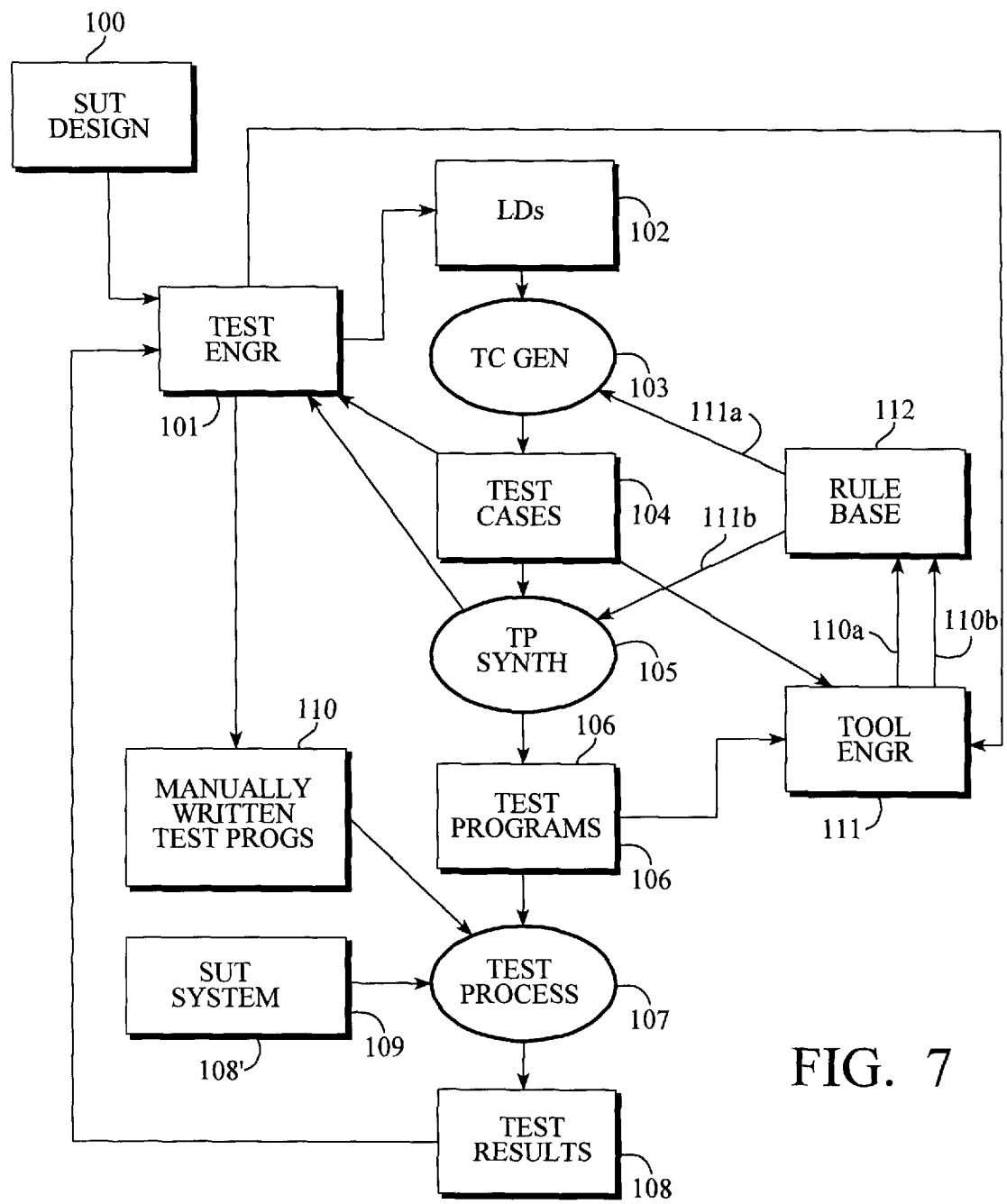
FIG. 7 is a diagram of feedback and enhancement steps of the test development method according to the present invention.

FIG. 7 is a diagram of feedback and enhancement steps of the test development method according to the present invention. In particular, the selected software (e.g., SUT) design 100 is employed by a test engineer 101 to generate logical descriptions 102 provided to a test case generator (TC Gen) 103 to produce test cases 104 in accordance with rule base 112. The test cases 104 are provided to a test program synthesizer 105 to produce test programs 106, subject to the requirements of rule base 112. Rule base 112 is established by a tool engineer 111. Test programs 106 are employed in a test process 109 to produce test results 108. Test process 107 is applied to the selected software (e.g., SUT) system 107 with both test programs 106 and manually written test programs 110. Feedback is provided in accordance with the presentation to the test engineer 101 from test cases 104, the test program synthesizer 105, and the test results 108, resulting in modification of logical descriptions 102, and the development of manually written test programs 110. Feedback is provided to tool engineer 111 from test cases 104, test programs 106, and the test engineer 101, resulting in an enhanced rule base 112.

Figure 8:
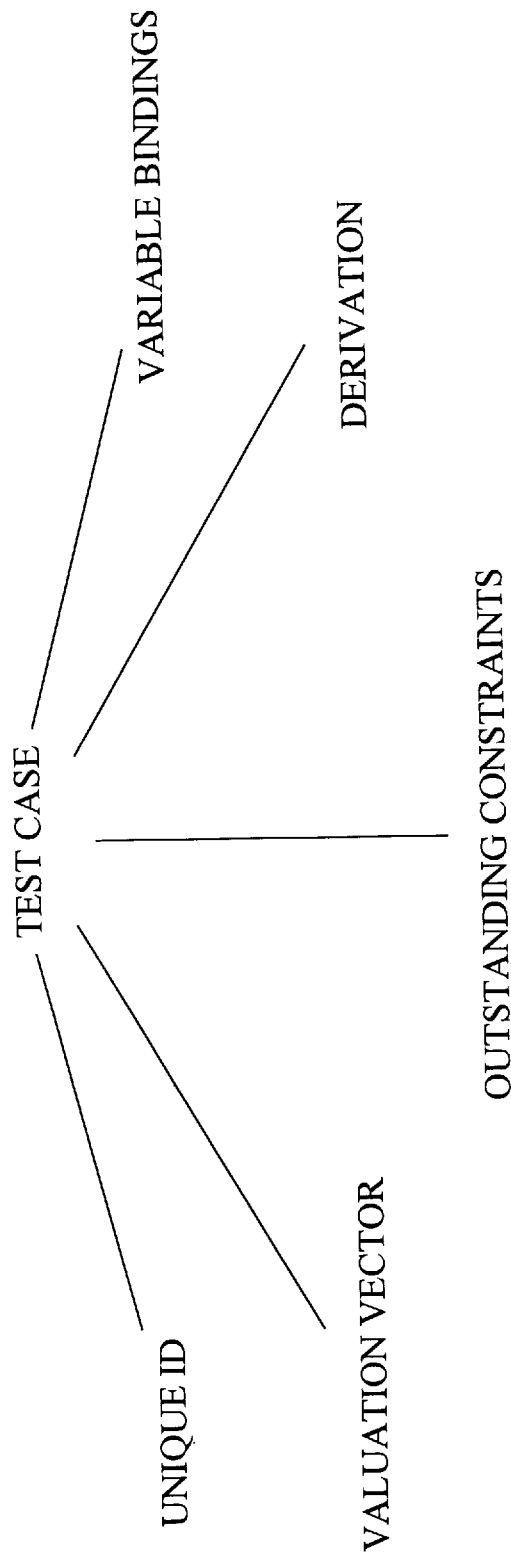
FIG. 8 is a diagram of the components of a test case representation in accordance with the present invention.

FIG. 8 is a diagram of a test case representation in accordance with the present invention. In particular, a test case can include a unique ID, a valuation vector which asserts or denies particular pre- or post-conditions, outstanding constraints, derivation, and variable bindings. There are three primary representations of test cases: (1) the internal representation in the logical database; (2) the external representation of multiple test cases as a limited-entry decision table; and (3) the external representation as a single test case as a test specification with optional expansion to pseudo-English. The internal representation of test cases, as depicted in FIG. 8, consists of a unique test-case identifier, a valuation over all the applicable pre- and post-condition predicates, a set of outstanding constraints, the derivation of the test case, and the bindings of any logical variables in the conditions.

FIG. 9 is an example of a simple limited entry decision table representing a suite of tests derived from a logical description in accordance with the present invention. In particular, the decision table compactly permits a view of abstract test cases, enabling recognition of patterns which may be significant. The decision table relates conditions and effects for a selected plurality of cases.

Figure 10:
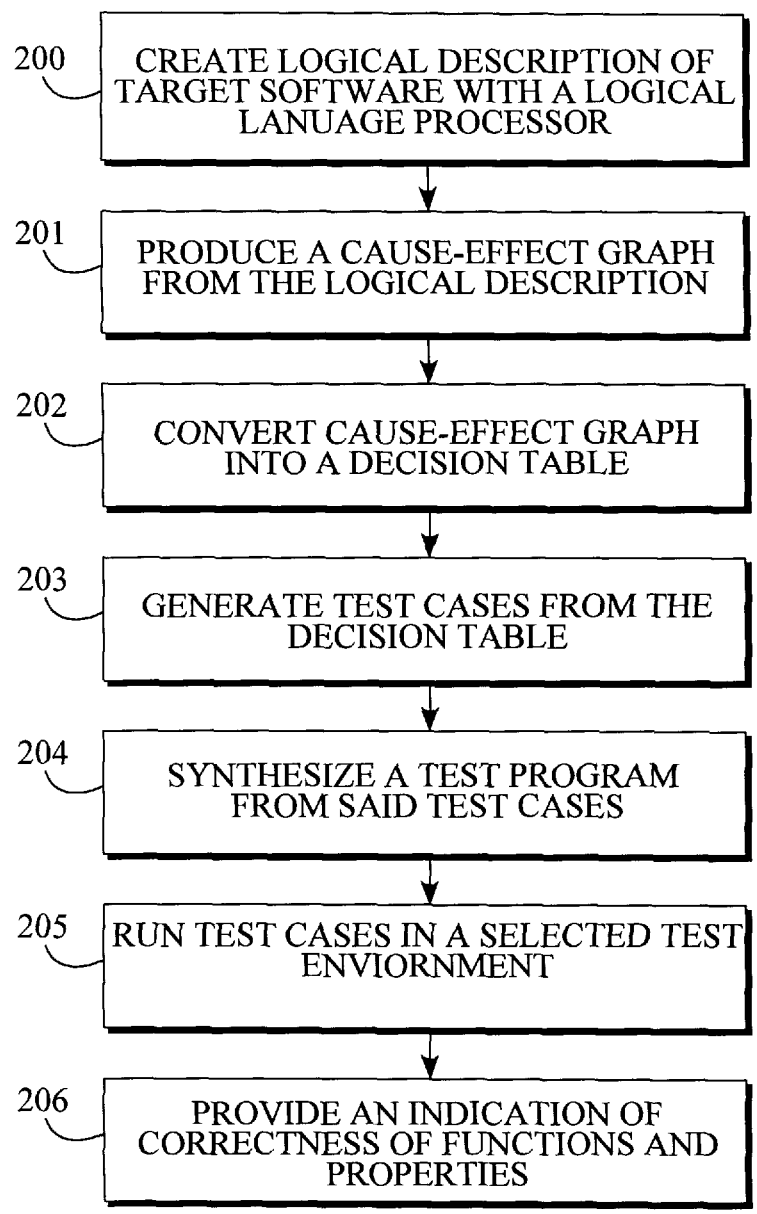
FIG. 10 is a flow chart of the method according to the present invention.

FIG. 10 is a flow chart of the overall method according to the present invention. In particular, a logical description is created 200 of a target software module. The target software module includes executable code. The logical description is created by interacting with a logical description language processor. The logical description is used to produce 201 a cause-effect graph. The cause-effect graph is converted 202 into a decision table. The decision table is used to produce 203 test cases. A test program is synthesized 204 for said test cases. The test program is run 205 in a selected test environment. The test program run provides 206 an indication of the correctness of the functions and properties of the target software.

This invention may be implemented by one skilled in the art of computers using a general purpose computer or microprocessor programmed according to the teachings herein. Appropriate software code can be readily prepared by skilled programmers based upon this specification. The invention may also be implemented with specific integrated circuits or by interconnecting an appropriate network of conventional component circuits, as will be readily apparent to those skilled in the art. The present invention includes a computer product which is a storage medium including instructions which can be used to program a computer to perform a method of the invention. The storage medium can include, but is not limited to, any type of fiber, disk, card, component, circuit, or software network (including local area, wide area, local operating networks or the Internet), floppy devices or disks, optical disks, ROMs, RAMs, EPROMs, EEPROMs, magnetic or optical material or optical cards, or any type of media or medium suitable for storing electronic instructions or data.

What is claimed is:

1. A software development system, comprising:

an interface for receiving a logical software description created with a logical language processor;

a logical database for communication with said interface;

a test case generation mechanism;

a test program synthesis mechanism; and a computer for controlling the logical database, the test generation module, and the test program synthesis module.

2. A method comprising:

creating a logical description of selected software;

organizing said logical description into a cause-effect graph;

converting the cause-effect chart into a decision table;

producing test cases from said decision table; and producing a test program by synthesizing said test cases, wherein said logical description is created with a logical language processor.

3. The method according to claim 2 wherein said logical description is stored in a logical database.

4. The method according to claim 2 including analyzing the logical description with selected heuristics.

5. The method according to claim 2 wherein said test cases are synthesized into a test program with a rule base.

6. The method according to claim 2 wherein said test program is translated into an imperative language.

7. The method according to claim 2 including running said test program in a selected test environment.

8. The method according to claim 7, including indicating correctness depending upon the results of said test program.

9. The method according to claim 2 including filtering invalid test cases.

10. The method according to claim 2 including determining test case selection based upon empirical observation.

11. A method of automated software test program generation comprising:

making a logical description of selected software;

producing at least a single test case from the logical description; and synthesizing a test program from the at least a single test case.

12. A computer product comprising a storage medium having computer readable code embodied therein for generating a software test program, the computer product comprising:

a computer readable program code device for receiving and storing a logical description of a selected software design;

a computer readable program code device for converting said logical description into a cause-effect graph;

a computer readable program code device for converting the cause-effect graph into a decision table;

a computer readable program code device for producing test cases from said decision table; and a computer readable program code device for producing a software test program by synthesizing test cases.

* * * * *